United States Patent
Shiraishi et al.

(10) Patent No.: US 10,814,418 B2
(45) Date of Patent: Oct. 27, 2020

(54) SOLDERING APPARATUS AND METHOD FOR MANUFACTURING ELECTRONIC UNIT

(71) Applicant: DENSO CORPORATION, Kariya, Aichi-pref. (JP)

(72) Inventors: Shinichiro Shiraishi, Kariya (JP); Mitsuhiro Sugiura, Kariya (JP); Chisato Ozawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 320 days.

(21) Appl. No.: 15/795,333

(22) Filed: Oct. 27, 2017

(65) Prior Publication Data
US 2018/0126474 A1 May 10, 2018

(30) Foreign Application Priority Data
Nov. 8, 2016 (JP) .................................. 2016-218285

(51) Int. Cl.
| | |
|---|---|
| B23K 1/012 | (2006.01) |
| H05K 3/34 | (2006.01) |
| B23K 3/02 | (2006.01) |
| B23K 3/06 | (2006.01) |
| B23K 1/00 | (2006.01) |
| B23K 101/42 | (2006.01) |

(52) U.S. Cl.
CPC ............ B23K 1/012 (2013.01); B23K 1/0016 (2013.01); B23K 3/028 (2013.01); B23K 3/0638 (2013.01); H05K 3/341 (2013.01); H05K 3/3468 (2013.01); B23K 2101/42 (2018.08); H05K 3/3447 (2013.01); H05K 2203/081 (2013.01)

(58) Field of Classification Search
CPC ........ B23K 3/028; B23K 1/02; B23K 1/0016; B08B 7/0085; B08B 7/0071
See application file for complete search history.

(56) References Cited

U.S. PATENT DOCUMENTS

| | | | | |
|---|---|---|---|---|
| 3,840,169 A | * | 10/1974 | Steranko | H05K 13/06 228/4.1 |
| 5,481,087 A | * | 1/1996 | Willemen | B23K 1/008 219/388 |
| 2017/0209903 A1 | * | 7/2017 | Sykes | B08B 5/02 |

FOREIGN PATENT DOCUMENTS

| | | |
|---|---|---|
| JP | 08-316627 A | 11/1996 |
| JP | 2002-217534 A | 8/2002 |
| JP | 2015-221449 A | 12/2015 |
| JP | 2016-124004 A | 7/2016 |
| JP | 2017-006937 A | 1/2017 |

* cited by examiner

*Primary Examiner* — Livius R. Cazan
(74) *Attorney, Agent, or Firm* — Posz Law Group, PLC

(57) ABSTRACT

A soldering apparatus has a soldering iron unit having a soldering tip for carrying out a soldering process to a printed circuit board, a heater unit for heating the soldering iron unit, and a gas supply device for operatively supplying a burning-assist gas to the soldering iron unit, when a cleaning process is carried out for the soldering iron unit. The cleaning process for the soldering iron unit is carried out when the soldering process to the printed circuit board is stopped. In the cleaning process, the soldering iron unit is heated by the heater unit and the burning-assist gas is supplied to the soldering iron unit, so that material attached to the soldering iron unit can be easily burnt out.

8 Claims, 6 Drawing Sheets

SOLDERING APPARATUS AND METHOD FOR MANUFACTURING ELECTRONIC UNIT

CROSS REFERENCE TO RELATED APPLICATION

This application is based on Japanese Patent Application No. 2016-218285 filed on Nov. 8, 2016, the disclosure of which is incorporated herein by reference.

FIELD OF TECHNOLOGY

The present disclosure relates to a soldering apparatus for carrying out a soldering process to a processing object (for example, a printed circuit board), a cleaning unit for the soldering apparatus and a method for manufacturing an electronic unit by use of the soldering apparatus.

BACKGROUND

A soldering apparatus is known in the art, for example, as disclosed in Japanese Patent Publication No. 2015-221449. The soldering apparatus is composed of a soldering iron unit having a soldering tip for carrying out a soldering process to a processing object, a first heater unit for heating the soldering iron unit, and so on.

In addition, the soldering apparatus of the above prior art has a second heater unit, which is used for cleaning the soldering iron unit. In a cleaning process for cleaning the soldering iron unit, the second heater unit is heated by use of remaining heat of the first heater unit or together with the first heater unit, so that the soldering tip of the soldering iron unit is heated to a temperature higher than 450 degrees to thereby remove material attached to the soldering tip. In addition, an air blow process is carried out after an end of a heating process of the second heater unit, to thereby forcibly remove the attached material, which remains at the soldering tip.

In the soldering apparatus of the prior art, two heater units are used in the cleaning process for the soldering tip in order to shorten a burning time of the attached material. However, it is difficult to properly control the heating process by use of the two heater units. When the soldering iron unit is heated up to a temperature higher than a necessary value, the soldering iron unit may be damaged by such a heat produced by excessively high temperature. On the other hand, when the heating process is not sufficiently done, complete burning of the attached material may not be carried out and a part of the attached material may remain at the soldering tip. As above, it is difficult to effectively remove the attached material from the soldering iron unit, while thermal damage to the soldering apparatus is suppressed to a small value.

SUMMARY OF THE DISCLOSURE

The present disclosure is made in view of the above problem. It is an object of the present disclosure to provide s soldering apparatus, according to which attached material is effectively removed from a soldering iron unit without causing thermal damage to the soldering apparatus.

According to one of features of the present disclosure, a soldering apparatus comprises;

a soldering iron unit having a soldering tip for carrying out a soldering process to a processing object;

a heater unit for heating the soldering iron unit; and a gas supply device for operatively supplying a burning-assist gas to the soldering iron unit when a cleaning process is carried out for the soldering iron unit.

According to the above feature of the present disclosure, the burning-assist gas is operatively supplied from the gas supply device to the soldering iron unit. For example, in the cleaning process for the soldering iron unit, since the soldering iron unit is heated and the burning-assist gas is supplied to facilitate burning of material attached to the soldering iron unit, it is possible to easily burn out the attached material. As a result, a thermal damage due to an excessive heating can be suppressed and a burning time can be shortened. Since incomplete burning of the attached material can be suppressed, the attached material hardly remains at the soldering iron unit. Accordingly, it is possible to provide the soldering apparatus, which can effectively remove the material attached to the soldering iron unit.

According to another feature of the present disclosure, a cleaning unit is used for a soldering apparatus, which comprises;

a soldering iron unit having a soldering tip for carrying out a soldering process to a processing object; and a heater unit for heating the soldering iron unit, wherein the cleaning unit carries out a cleaning process for cleaning the soldering iron unit.

The cleaning unit comprises a gas supply device for operatively supplying burning-assist gas to the soldering iron unit, and the gas supply device comprises;

a gas separating unit for separating air into nitrogen gas having a nitrogen density higher than that of the air and oxygen-rich gas having an oxygen density higher than that of the air, wherein the oxygen-rich gas is used as the burning-assist gas; and a gas switching unit for switching gas to be supplied to the soldering iron unit from the nitrogen gas to the oxygen-rich gas, or vice versa.

According to the above cleaning unit, the burning-assist gas is operatively supplied from the gas supply device to the soldering iron unit. For example, in the cleaning process for the soldering iron unit, not only the soldering iron unit is heated but also the burning-assist gas is supplied to the soldering iron unit in order to facilitate the burning of the material attached to the soldering iron unit. Therefore, it is possible to easily burn out the attached material. As a result, the thermal damage due to the excessive heating can be suppressed and the burning time can be shortened. In addition, since the incomplete burning of the attached material can be suppressed, the attached material hardly remains at the soldering iron unit. Accordingly, it is possible to effectively remove the material attached to the soldering iron unit.

In addition, according to the cleaning unit of the present disclosure, the gas to be supplied to the soldering iron unit is switched by the gas switching unit from the oxygen-rich gas to the nitrogen gas when the soldering process is carried out to the processing object. As a result, it is possible to suppress the oxidization of the solder.

On the other hand, the gas to the soldering iron unit is changed from the nitrogen gas to the oxygen-rich gas (the burning-assist gas) when the cleaning process is carried out for the soldering iron unit. As a result, it is possible to facilitate the burning of the material attached to the soldering iron unit. The nitrogen gas and the oxygen-rich gas are produced by separating the air by the gas separating unit, so that the nitrogen gas and the oxygen-rich gas are effectively supplied to the soldering iron unit. Accordingly, it is possible to effectively remove the material attached to the soldering iron unit.

According to a further feature of the present disclosure, a manufacturing method for an electronic control unit comprises a method for manufacturing the electronic control unit by use of the soldering apparatus of the present disclosure. The electronic control unit has a printed circuit board to which an electronic component is mounted by use of the soldering apparatus, which comprises;

a soldering iron unit having a soldering tip for carrying out a soldering process to the printed circuit board;

a heater unit for heating the soldering iron unit; and a gas supply device for operatively supplying a burning-assist gas to the soldering iron unit when a cleaning process is carried out for the soldering iron unit.

The method for manufacturing the electronic control unit comprises;

a soldering step, in which solder is supplied to the soldering iron unit and the soldering process to the printed circuit board is carried out by the soldering tip, which is heated by the heater unit; and a cleaning step, which is carried out when the soldering process to the printed circuit board is stopped, and in which the soldering iron unit is heated by the heater unit and the burning-assist gas is supplied from the gas supply device to the soldering iron unit in order to clean the soldering iron unit.

According to the above feature of the present disclosure, the cleaning process is carried out for the soldering iron unit when the soldering process to the printed circuit board is stopped. In the cleaning process, the soldering iron unit is heated by the heater unit and the burning-assist gas is supplied from the gas supply device to the soldering iron unit. Since, in the cleaning process, the burning of the material attached to the soldering iron unit is facilitated by the burning-assist gas, it is possible to easily burn out the attached material. As a result, the thermal damage due to the excessive heating can be suppressed and the burning time can be shortened. In addition, since the incomplete burning of the attached material can be suppressed, the attached material hardly remains at the soldering iron unit. Since the soldering process is carried out while the influence by the attached material is suppressed, it is possible to increase quality of the electronic control unit.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION OF THE EMBODIMENTS

Figure 1:
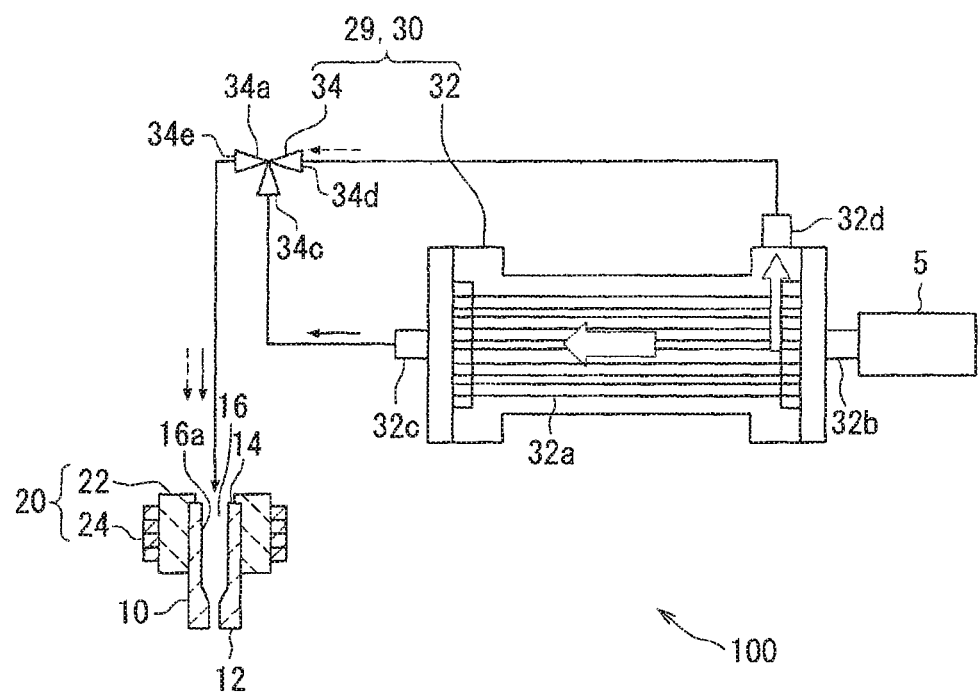
FIG. 1 is a schematic view showing a structure of a soldering apparatus according to an embodiment of the present disclosure.

The present disclosure will be explained hereinafter by way of multiple embodiments and/or modifications with reference to the drawings. The same reference numerals are given to the same or similar parts or portions throughout the multiple embodiments and/or modifications in order to eliminate repeated explanation.

Embodiment

Figure 2:
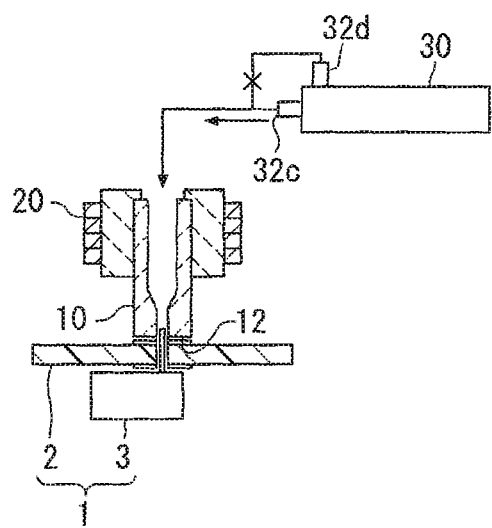
FIG. 2 is a schematic view showing a soldering process to a printed circuit board by the soldering apparatus of FIG. 1.

A soldering apparatus 100 shown in FIG. 1 is an apparatus for carrying out a soldering process to a printed circuit board 2 (a processing object). As shown in FIG. 2, an electronic component 3 is mounted to the printed circuit board 2 by the soldering process, so that an electronic control unit 1 for performing various kinds of controls is manufactured.

As shown in FIGS. 1 to 4, the soldering apparatus 100 is composed of a soldering iron unit 10, a heater unit 20, a gas supply device 30, a forward-end cover member 40, a control unit 50 and so on. A cleaning unit 29, which is composed of the gas supply device 30, the forward-end cover member 40 and so on, cleans the soldering iron unit 10.

The soldering iron unit 10 is made of metal having high heat conductivity. The soldering iron unit 10 may be also made of ceramic material. In the present specification, the portion 10 is referred to as the soldering iron unit 10, independently of the material of which the portion 10 is made. The soldering iron unit 10 has a soldering tip 12 with which the soldering process is done to the printed circuit board 2. The soldering iron unit 10 is formed in a cylindrical shape for forming a solder supply passage portion 16. The solder supply passage portion 16 of a cylindrical hollow shape passes through a center of the soldering iron unit 10 in an axial direction from the soldering tip 12 to a backward-end side 14, which is on an opposite side to the soldering tip 12. A part of the solder supply passage portion 16 is restricted at a position closer to the soldering tip 12, so that an inner diameter at such a restricted portion is smaller than that of other part of the solder supply passage portion 16.

Although not shown in the drawings, a wire solder and a cutting unit are located above the backward-end side 14 of the solder supply passage portion 16. The solder wire is cut off at a predetermined length by the cutting unit and such a cut wire solder drops into the solder supply passage portion 16 from the backward-end side 14. The wire solder is molten in the solder supply passage portion 16 by heat generated by the heater unit 20. The molten solder flows from the soldering tip 12 out of the solder supply passage portion 16. As above, the solder supply passage portion 16 supplies the solder from the backward-end side 14 to the soldering tip 12.

The heater unit 20 is composed of a heater block 22 and an electric heater 24.

The heater block 22 is formed in a cylindrical shape so as to surround an outer periphery of the backward-end side 14 of the soldering iron unit 10. The heater block 22 supports the electric heater 24, which is formed in such a manner that a heating wire is wound on an outer periphery of the heater block 22 so as to heat the soldering iron unit 10. The electric heater 24 is controlled based on a temperature of the soldering iron unit 10 detected by a temperature sensor (not shown) in order that the temperature of the soldering iron unit 10 is controlled at a predetermined temperature range. As explained above, the wire solder is molten when the soldering iron unit 10 is heated by the heater unit 20. The temperature of the soldering iron unit 10 is controlled, for example, at a value between 400 and 550 degrees.

The soldering iron unit 10 and the heater unit 20 are integrally formed with each other. The soldering iron unit 10 as well as the heater unit 20 is movable by a moving unit 70 (FIG. 4), so that the soldering iron unit 10 as well as the heater unit 20 moves to a soldering position of the printed circuit board 2.

The gas supply device 30 is composed of a gas separating unit 32 and a gas switching unit 34. The gas separating unit 32 has a gas separation film 32a for separating air into nitrogen gas having a nitrogen density higher than that of the air and oxygen-rich gas having an oxygen density higher than that of the air. The gas separating unit 32 has an air inlet port 32b, a nitrogen gas outlet port 32c and an oxygen-rich gas outlet port 32d. The air inlet port 32b is connected to a compressed air supply unit 5 via a tube (not shown), wherein the compressed air supply unit 5 is provided, for example, in a factory. The compressed air is supplied to the gas separation film 32a. When a part of the compressed air passes through the gas separation film 32a, the nitrogen density is increased. In other words, the nitrogen density of the air after passing through the gas separation film 32a becomes higher than that of the air before passing through the gas separation film 32a. Thus, the air having higher nitrogen density (which is referred to as nitrogen gas) is discharged from the nitrogen gas outlet port 32c. On the other hand, the oxygen density of the remaining compressed air not passing through the gas separation film 32a is relatively increased, as a result that the nitrogen is taken out as the nitrogen gas from the nitrogen gas outlet port 32c. Therefore, the oxygen-rich gas is discharged from the oxygen-rich gas outlet port 32d.

The gas switching unit 34 is composed of a switching valve 34a for switching gas to be supplied to the soldering iron unit 10 from the nitrogen gas to the oxygen-rich gas, or vice versa. The gas switching unit 34 has a nitrogen gas inlet port 34c, an oxygen-rich gas inlet port 34d and a supply gas outlet port 34e. The nitrogen gas outlet port 32c of the gas supply device 30 is connected to the nitrogen gas inlet port 34c of the gas switching unit 34 via a tube. The oxygen-rich gas outlet port 32d of the gas supply device 30 is connected to the oxygen-rich gas inlet port 34d of the gas switching unit 34 via another tube. The gas switching unit 34 supplies one of the nitrogen gas and the oxygen-rich gas from the supply gas outlet port 34e to the soldering iron unit 10 via a tube or the like.

One of the nitrogen gas and the oxygen-rich gas, which is supplied to the soldering iron unit 10, passes through the solder supply passage portion 16 from the backward-end side 14 to the soldering tip 12. The nitrogen gas is used when the soldering process is carried out. The oxygen-rich gas is used when the cleaning process is carried out for the soldering iron unit 10.

Figure 3:
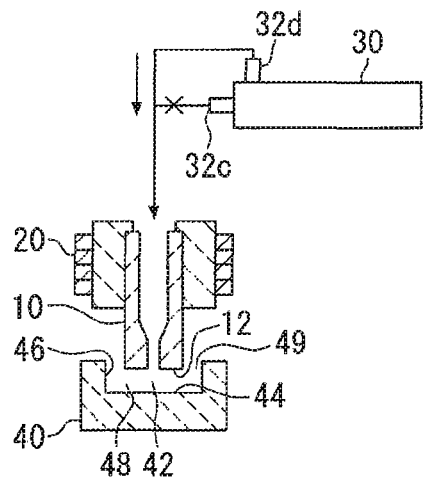
FIG. 3 is a schematic view showing a cleaning process for a soldering iron unit of the soldering apparatus of FIG. 1.

As shown in FIG. 3, the forward-end cover member 40 is made of material (for example, ceramic material) having heat conductivity lower than that of the soldering iron unit 10. The forward-end cover member 40 is located at a position, which is within a movable range of the soldering iron unit 10. Hereinafter, the position of the forward-end cover member 40 in a case of the cleaning process is also referred to as a cleaning position. The forward-end cover member 40 has a cylindrical hole 42 with a closed bottom end.

When the oxygen-rich gas is supplied to the soldering iron unit 10, that is, when the soldering iron unit 10 is cleaned up, the soldering iron unit 10 is moved to the cleaning position and the soldering tip 12 is inserted into the cylindrical hole 42. The soldering tip 12 is inserted into the cylindrical hole 42 with a radial gap and an axial gap with an inner wall surface of the cylindrical hole 42, so that the soldering tip 12 is covered by the forward-end cover member 40. More exactly, in a condition that the soldering tip 12 is covered by the forward-end cover member 40, the axial gap 48 is formed between the soldering tip 12 and a bottom end 44 of the cylindrical hole 42, while the radial gap 49 is formed between the soldering tip 12 and a side wall 46 of the cylindrical hole 42. An inside space of the cylindrical hole 42 is communicated to an outside of the forward-end cover member 40 via the radial gap 49. A radial distance of the radial gap 49 between the soldering tip 12 and the side wall 46 is set at a value, which is smaller than an axial distance of the axial gap 48 between the soldering tip 12 and the bottom end 44 of the cylindrical hole 42. However, the radial distance may be formed as to be equal to the axial distance.

Figure 4:
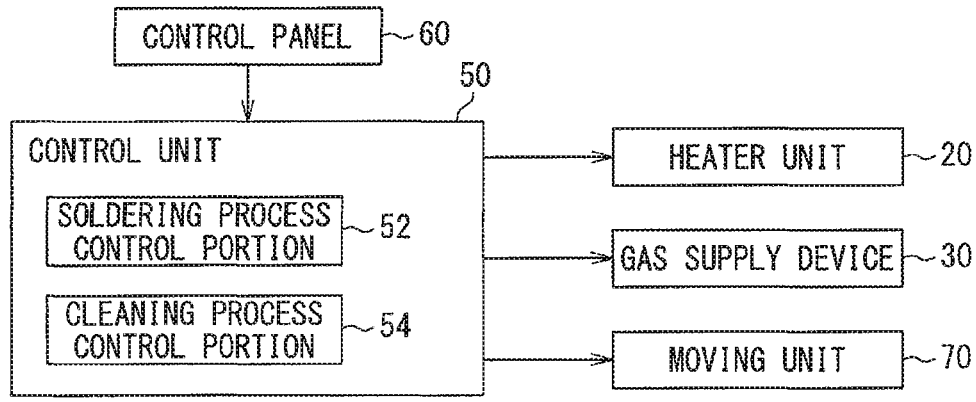
FIG. 4 is a block diagram for explaining a control unit of the soldering apparatus.

As shown in FIG. 4, the control unit 50 is composed of an electronic circuit, which is formed by a processor, a memory device, input/output terminals and so on, which are mounted to the printed circuit board. When the processor carries out computer programs memorized in the memory device, various kinds of controls can be performed. When an operator manually operates a control panel 60, the soldering apparatus 100 can be manually operated via the control unit 50.

The control unit 50 has a soldering process control portion 52 and a cleaning process control portion 54, each of which is a functional block formed by the electronic circuits.

The soldering process control portion 52 carries out the soldering process to the printed circuit board 2, which is located at the position within the movable range of the soldering iron unit 10. More exactly, the soldering process control portion 52 moves the soldering iron unit 10 to a predetermined soldering position corresponding to a position of the electronic component 3. Then, the soldering iron unit 10 supplies the solder from the soldering tip 12 to a terminal portion, such as, a lead wire of the electronic component 3. According to the soldering process, the electronic component 3 can be firmly supported by the printed circuit board 2 and the terminal portion is electrically connected to a wiring pattern of the printed circuit board 2. In the soldering process, the heater unit 20 heats the soldering iron unit 10 in such a way that the temperature of the soldering iron unit 10 is controlled, for example, at the temperature of 450 degrees.

In addition, the soldering process control portion 52 controls the gas supply device 30 in such a way that the nitrogen gas is supplied to the soldering iron unit 10 during the soldering process. In other words, the nitrogen gas is selected by the gas switching unit 34 as the gas to be supplied to the soldering iron unit 10.

When the soldering process is repeatedly carried out, the material attached to an inner wall 16a of the solder supply passage portion 16 and the solder tip 12 is gradually increased. A main component of the attached material is flux included in the solder and having adhesion. When the amount of the attached material is increased, the solder flowing through the solder supply passage portion 16 may get hung up with the attached material. Then, a soldering defect may occur.

Figure 5:
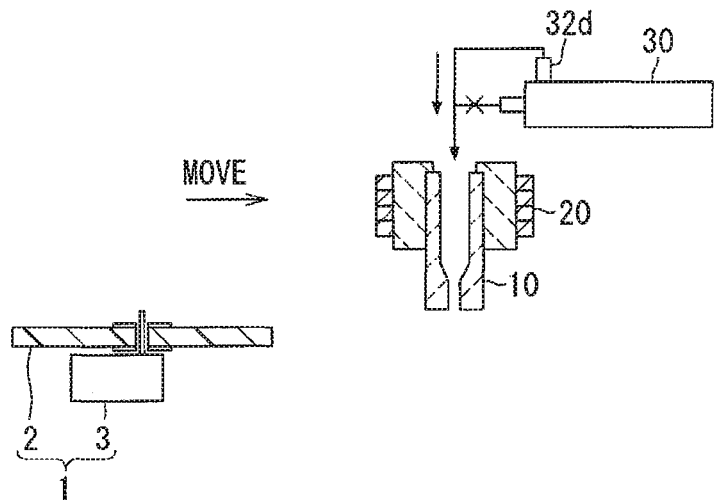
FIG. 5 is a schematic view showing a process for moving the soldering iron unit of FIG. 1 to a cleaning position.

It is, therefore, necessary to carry out the cleaning process for the soldering iron unit 10 in order to avoid the soldering defect. According to the present embodiment, as shown in FIGS. 3 and 5, the cleaning process control portion 54 moves the soldering iron unit 10 to the cleaning position, during a period in which the soldering process for the printed circuit board 2 is stopped. More exactly, the soldering iron unit 10 is moved to the cleaning position, which is also within the movable range of the soldering iron unit 10 but at which the printed circuit board 2 is not located. Then, the cleaning process for the soldering iron unit 10 is carried out. More in detail, the soldering iron unit 10 is moved to the cleaning position, at which the forward-end cover member 40 is located. Then, the heater unit 20 is controlled by the cleaning process control portion 54 so as to heat the soldering iron unit 10. In the cleaning process, the soldering iron unit 10 is heated to the temperature of, for example, 550 degrees, which is higher than that during the soldering process.

In addition to the above heating operation by the heater unit 20, the cleaning process control portion 54 controls the gas supply device 30 in such a way that the oxygen-rich gas is supplied to the soldering iron unit 10. In other words, the gas switching unit 34 selects the oxygen-rich gas as the gas to be supplied to the soldering iron unit 10. The oxygen-rich gas functions as a burning-assist gas for assisting the burning of the material attached to the soldering iron unit 10, so that the attached material is smoothly burnt out.

The cleaning process control portion 54 restricts the heating operation of the heater unit 20 after a predetermined burning time has passed over, in order that the temperature of the soldering iron unit 10 goes back to the temperature of the soldering process. In addition, the cleaning process control portion 54 controls the gas supply device 30 in such a way that the supply of the oxygen-rich gas to the soldering iron unit 10 is stopped. When the above cleaning process is finished, the soldering process is started again.

Figure 6:
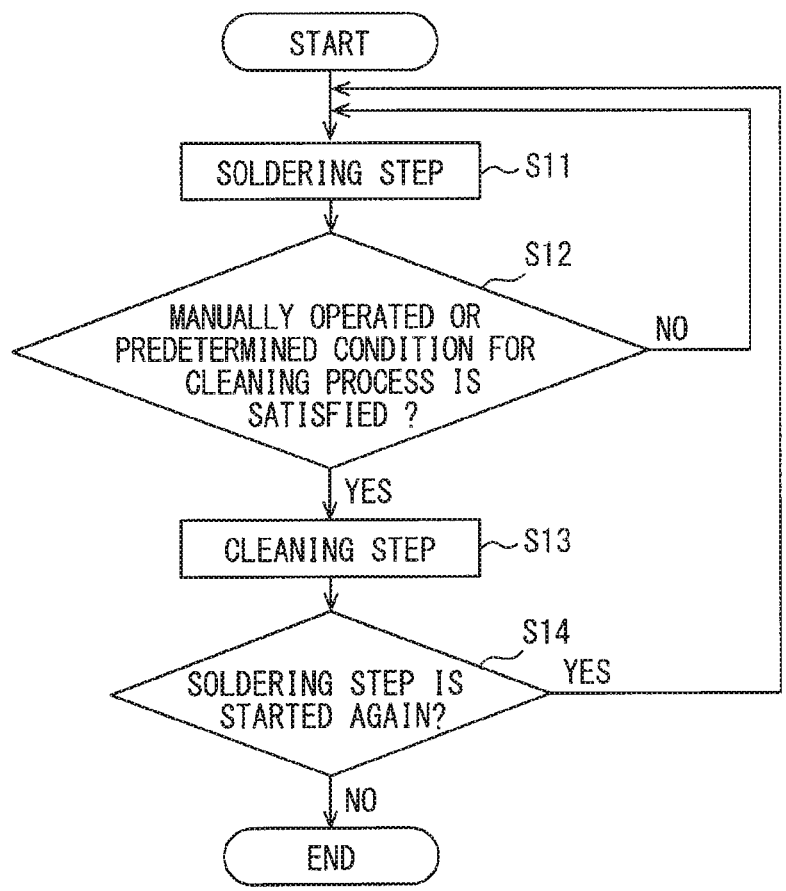
FIG. 6 is a flow chart for explaining a relationship between the soldering process and the cleaning process.

A manufacturing process for the electronic control unit 1 by use of the soldering apparatus 100, in particular, the manufacturing process including the soldering process and the cleaning process will be explained with reference to a flow chart shown in FIG. 6.

In a soldering step S11, the solder is supplied to the soldering iron unit 10 by the control of the soldering process control portion 52 and the soldering process is carried out by the soldering tip 12, which is heated by the heater unit 20. When the soldering process for one of the printed circuit boards 2 is completed, the soldering step S11 is carried out again for another printed circuit board 2 in the similar manner.

A cleaning step S13 is carried out during the period in which the soldering process to the printed circuit board 2 is stopped. In other words, the cleaning step S13 is carried out between the soldering steps S11. It is not always necessary to carry out the cleaning step S13 each time when the soldering step S11 is done. For example, the cleaning step S13 may be manually carried out by the manual operation of an operator at a step S12. Alternatively, the cleaning step S13 may be carried out several times in a month. Furthermore, the cleaning step S13 may be automatically carried out, when a predetermined condition is satisfied, as indicated by the step S12 in FIG. 6. The predetermined condition includes, for example, a condition whether a predetermined number of the soldering steps S11 is carried out from a previous cleaning step S13.

In the cleaning step S13, the soldering iron unit 10 is heated by the heater unit 20 by the control of the cleaning process control portion 54. In addition, the oxygen-rich gas is supplied from the gas supply device 30 so as to clean up the soldering iron unit 10. The soldering step is started again at a step S14, after the cleaning step S13 is carried out.

The cleaning step S13 will be further explained with reference to a flow chart shown in FIG. 7.

Figure 7:
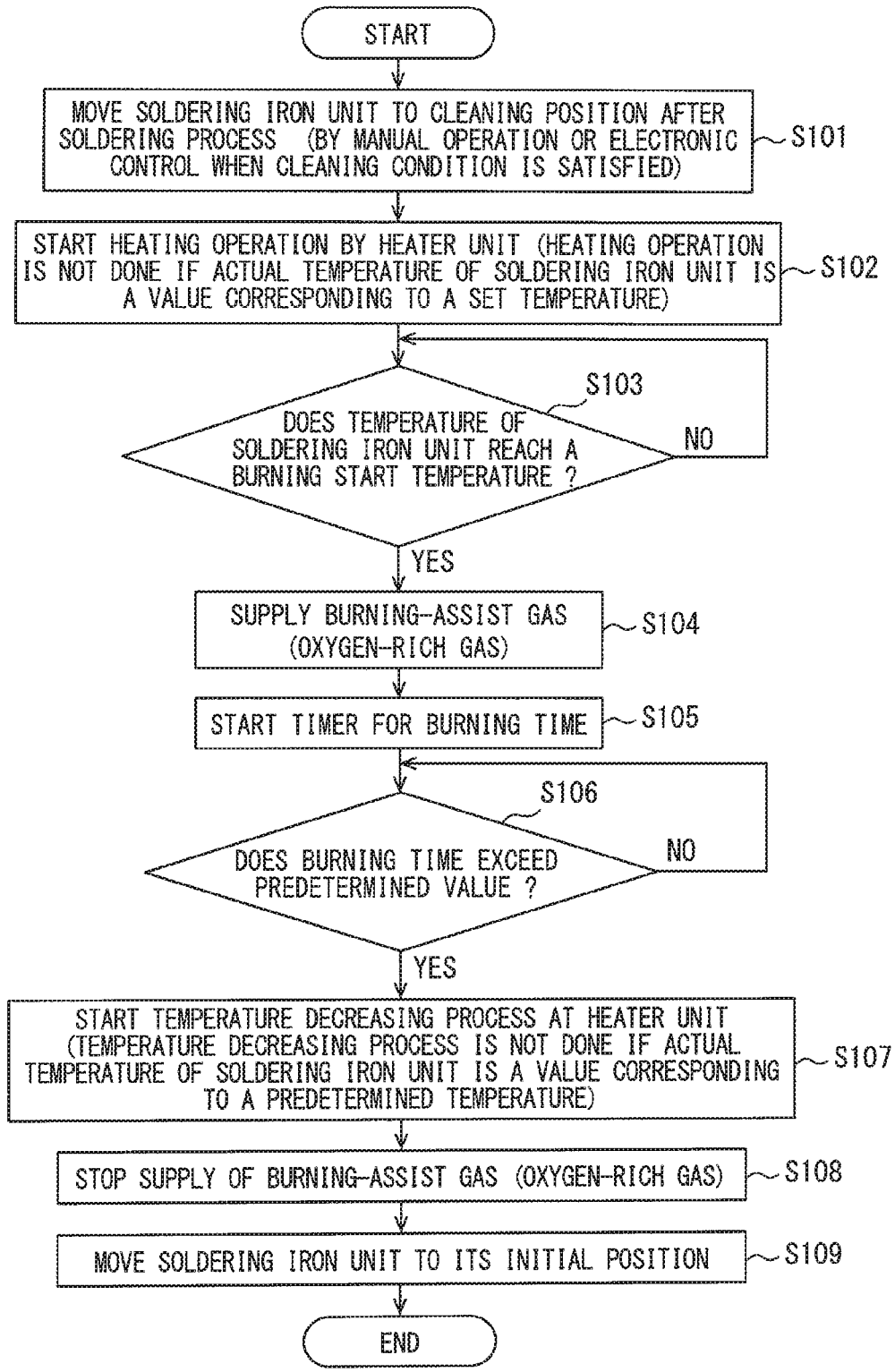
FIG. 7 is a flow chart showing the cleaning process for the soldering iron unit.

At first, the cleaning process control portion 54 of the control unit 50 moves the soldering iron unit 10 to the cleaning position at a step S101 in FIG. 7. The process goes to a step S102 after the step S101.

At the step S102, the cleaning process control portion 54 starts the heating operation by the heater unit 20 in order to increase the temperature of the heater unit 20. In accordance with the heating operation, the soldering iron unit 10 is heated so that the temperature thereof is increased. The process moves to a step S103 after the heating operation at the step S102.

At the step S103, the cleaning process control portion 54 determines whether the temperature of the soldering iron unit 10 reaches a burning start temperature (for example, 550 degrees). When the determination at the step S103 is NO, the heating operation for the soldering iron unit 10 is continued in order that the temperature of the soldering iron unit 10 will be further increased. Then, the determination at the step S103 is done again. When the determination at the step S103 is YES, the process goes to a step S104.

At the step S104, the cleaning process control portion 54 starts the supply of the oxygen-rich gas (the burning-assist gas) to the soldering iron unit 10. When the supply of the oxygen-rich gas is started, the process moves to a step S105, at which a timer for the burning time starts. The process further moves from the step S105 to a step S106.

At the step S106, the cleaning process control portion 54 determines whether the burning time exceeds a predetermined value set by the timer. When the determination at the step S106 is NO, the process goes back to the Step S106 so that the cleaning process control portion 54 carries out again the step S106 after a predetermined time. When the determination at the step S106 is YES, the process goes to a step S107.

At the step S107, the cleaning process control portion 54 starts a decreasing process for the temperature at the heating unit 20. The temperature of the soldering iron unit 10 is thereby decreased. The process goes to a step S108 after the step S107.

At the step S108, the cleaning process control portion 54 stops the supply of the oxygen-rich gas (the burning-assist gas) to the soldering iron unit 10. Then, the process goes to a step S109 after the step S108.

At the step S109, the cleaning process control portion 54 moves the soldering iron unit 10 to a predetermined initial position for starting again the soldering process. Then, the process of FIG. 7 goes to an end.

Figure 8:
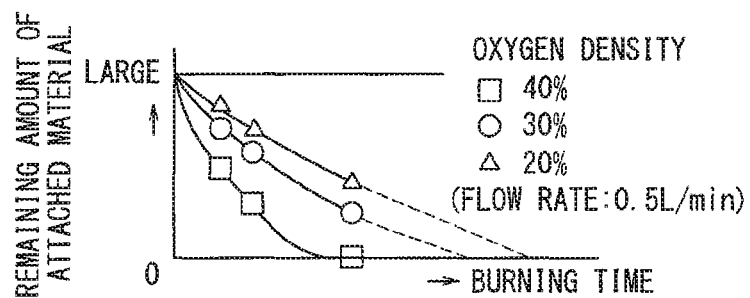
FIG. 8 is a graph showing a relationship between a remaining amount of attached material with respect to a burning time, when oxygen density is changed.

Experimental results for the relationship between the burning time and the remaining amount of the attached material will be explained with reference to graphs of FIGS. 8 and 9, wherein the experiments are done in a condition that the material attached to the soldering iron unit 10 is burnt out by use of the oxygen-rich gas. As shown in FIG. 8, the remaining amount of the attached material is deceased in accordance with elapse of the burning time. When the oxygen density of the oxygen-rich gas is changed from 20% to 30% or to 40%, the remaining amount of the attached material is correspondingly decreased. The remaining amount of the attached material is most rapidly decreased in a case of the oxygen density of 40%. In other words, it is possible to shorten the burning time when the oxygen density is increased.

Figure 9:
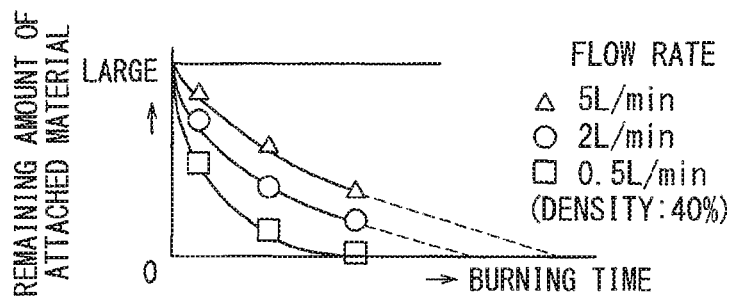
FIG. 9 is another graph showing the relationship between the remaining amount of the attached material with respect to the burning time, when flow rate is changed.

As shown in FIG. 9, when a flow rate of the oxygen-rich gas is changed from 0.5 L/min to 2 L/min or to 5 L/min, the remaining amount of the attached material is correspondingly increased. The remaining amount of the attached material can be most rapidly decreased in a case of the flow rate of 0.5 L/min. In other words, the burning of the attached material cannot be sufficiently facilitated, when the flow rate of the oxygen-rich gas is too high, because the soldering iron unit 10 is cooled down by such large amount of the oxygen-rich gas.

As above, it is important to properly control the density and the supply amount of the oxygen-rich gas, the temperature of the heater unit and so on.

Advantages

Advantages of the above explained embodiment will be explained.

In the soldering apparatus of the present embodiment, the oxygen-rich gas is supplied from the gas supply device 30 to the soldering iron unit 10 as the burning-assist gas. In the cleaning process for the soldering iron unit 10, the oxygen-rich gas is supplied to the soldering iron unit 10 in addition to the heating process for the soldering iron unit 10, in order to facilitate the burning of the material attached to the soldering iron unit 10. As above, it is possible to easily burn out the attached material. Accordingly, it is possible not only to suppress the thermal damage to the soldering iron unit due to the excessive heating operation but also to shorten the burning time of the attached material. In addition, the attached material hardly remains at the soldering iron unit 10, because incomplete burning of the attached material is suppressed. Accordingly, it is possible to provide the soldering apparatus 100, according to which the material attached to the soldering iron unit 10 can be effectively removed.

In addition, in the present embodiment, the gas to be supplied to the soldering iron unit 10 is changed by the gas switching unit 34 from the oxygen-rich gas to the nitrogen gas when the soldering process is carried out to the printed circuit board 2. It is thereby possible to suppress oxidization of the solder.

On the other hand, the gas to be supplied to the soldering iron unit 10 is changed to the oxygen-rich gas, when the cleaning process is carried out for the soldering iron unit 10. It is thereby possible to facilitate the burning of the material attached to the soldering iron unit 10.

The air is separated by the gas supply device 30 into the nitrogen gas and the oxygen-rich gas, so that the nitrogen gas and the oxygen-rich gas can be effectively supplied to the soldering iron unit 10. In other words, it is possible to provide the soldering apparatus 100 which can effectively remove the material attached to the soldering iron unit 10.

In addition, in the present embodiment, the oxygen-rich gas is supplied to the soldering iron unit 10 so that the oxygen-rich gas flows through the solder supply passage portion 16 from the backward-end side 14 to the soldering tip 12. Since the oxygen-rich gas is supplied to the soldering iron unit 10 by use of the solder supply passage portion 16, it is possible to easily burn out the material attached to the inner peripheral wall 16a of the solder supply passage portion 16. In addition, since the oxygen-rich gas (the burning-assist gas) is supplied to the soldering tip 12, it is also possible to easily burn out the material attached to the soldering tip 12.

In addition, in the present embodiment, the forward-end cover member 40 covers the soldering tip 12, when the oxygen-rich gas is supplied to the soldering iron unit 10. As a result, the oxygen-rich gas having reached the soldering tip 12 from the solder supply passage portion 16 is temporarily accumulated in the space formed between the soldering iron unit 10 and the forward-end cover member 40, so that the space surrounding the soldering tip 12 is made to be an oxygen-rich atmosphere. Therefore, it is possible to facilitate the burning of the material attached to the soldering tip 12.

Furthermore, since the forward-end cover member 40 covers the soldering tip 12 with the radial and the axial gaps 46 and 48, gas having used for burning the attached material can be smoothly discharged to an outside of the forward-end cover member 40. It is therefore possible to prevent a situation that the gas used for the burning of the attached material stays around the soldering tip 12. In other words, it is possible to continuously supply fresh oxygen-rich gas to the space surrounding the soldering tip 12.

In addition, in the present embodiment, the cylindrical hole 42 of the forward-end cover member 40 forms the axial gap 48 between the bottom end 44 and the soldering tip 12 in the axial direction and the radial gap 49 between the side wall 46 and the soldering tip 12 in the radial direction, wherein the radial gap 49 is opened to the outside of the forward-end cover member 40.

The material is most likely to be attached to the soldering tip 12. However, since the oxygen-rich gas is temporarily accumulated in the space of the axial gap 48, the burning of the attached material is facilitated in the space adjacent to the soldering tip 12. Furthermore, the oxygen-rich gas used for burning the attached material can be smoothly discharged to the outside of the forward-end cover member 40 via the space of the radial gap 49.

In addition, in the present embodiment, since the heat conductivity of the soldering iron unit 10 is relatively high, the heat generated by the heater unit 20 can be effectively transferred to the soldering tip 12. Furthermore, since the heat conductivity of the forward-end cover member 40 is relatively low, the heat around the soldering tip 12 can be hardly radiated to the outside of the forward-end cover member 40. In other words, it is possible to effectively heat the soldering iron unit 10.

In addition, in the present embodiment, the cleaning process control portion 54 carries out the cleaning process in the following manner, during the period in which the soldering process to the printed circuit board 2 is stopped. The cleaning process control portion 54 controls not only the heater unit 20 so as to heat the soldering iron unit 10 but also the gas supply device 30 so as to supply the oxygen-rich gas to the soldering iron unit 10. Since not only the soldering iron unit 10 is heated but also the oxygen-rich gas is supplied to the soldering iron unit 10, it is possible to effectively remove the material attached to the soldering iron unit 10.

In addition, according to the cleaning unit 29 of the present embodiment, the oxygen-rich gas can be supplied from the gas supply device 30 to the soldering iron unit 10. For example, in the cleaning process for the soldering iron unit 10, the burning of the material attached to the soldering iron unit 10 can be facilitated by the oxygen-rich gas, because the soldering iron unit 10 is heated and the oxygen-rich gas is additionally supplied to the soldering iron unit 10.

Therefore, it is possible to easily burn out the attached material. Accordingly, it is possible not only to suppress the thermal damage owing to the excessive heating but also to shorten the burning time. Since the incomplete burning of the attached material can be suppressed, the attached material hardly remains at the soldering iron unit 10. It is thereby possible to effectively remove the material attached to the soldering iron unit 10.

In addition, according to the cleaning unit 29 of the present embodiment, the gas to be supplied to the soldering iron unit 10 is switched by the gas switching unit 34 from the oxygen-rich gas to the nitrogen gas, when the soldering process is carried out to the printed circuit board 2. It is thereby possible to suppress the oxidization of the solder. On the other hand, when the cleaning process is carried out, the gas to be supplied to the soldering iron unit 10 is switched from the nitrogen gas to the oxygen-rich gas. As a result, it is possible to facilitate the burning of the material attached to the soldering iron unit 10. The nitrogen gas and the oxygen-rich gas can be effectively supplied to the soldering iron unit 10, when the air is separated by the gas separating unit 32. Accordingly, it is possible to effectively remove the material attached to the soldering iron unit 10.

In addition, according to the manufacturing method for the electronic control unit of the present embodiment, the soldering iron unit 10 is heated by the heater unit 20 and the oxygen-rich gas is supplied from the gas supply device 30 to the soldering iron unit 10 in order to carry out the cleaning process for the soldering iron unit 10, when the soldering process for the printed circuit board 2 is stopped. Since the oxygen-rich gas facilitates the burning of the material attached to the soldering iron unit 10 in the cleaning process, it is possible to easily burn out the attached material. In other words, it is possible to suppress the thermal damage due to the excessive heating and to shorten the burning time of the attached material. In addition, the attached material hardly remains at the soldering iron unit 10, because the incomplete burning of the attached material is suppressed. Since the soldering process can be done by suppressing the influence of the attached material, it is possible to increase quality of the electronic control unit 1.

Further Embodiments and/or Modifications

The present disclosure is not limited to the above embodiment but can be further modified in various manners without departing from a spirit of the present disclosure.

First Modification

Figure 10:
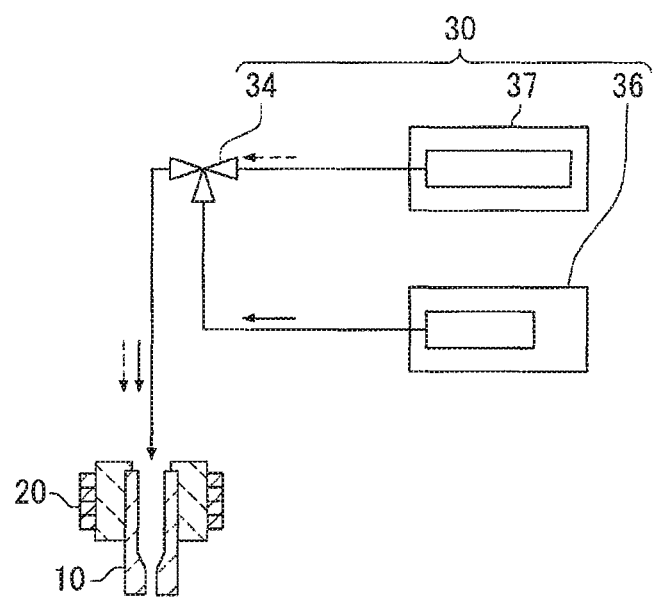
FIG. 10 is a schematic view showing the structure of the soldering apparatus according to a first modification of the present disclosure.

For example, as shown in FIG. 10, the gas supply device 30 has a nitrogen bomb 36 filled with nitrogen gas and an oxygen bomb 37 filled with oxygen-rich gas. The gas switching unit 34 switches the gas to be supplied to the soldering iron unit 10 from the nitrogen gas from the nitrogen bomb 36 to the oxygen-rich gas from the oxygen bomb 37, or vice versa.

Second Modification

Figure 11:
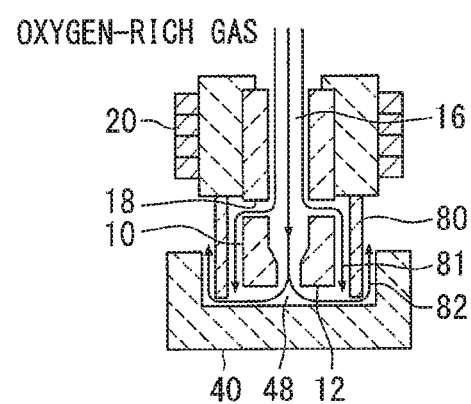
FIG. 11 is a schematic view showing a cover member for the soldering iron unit according to a second modification of the present disclosure.

As shown in FIG. 11, a cylindrical sleeve member 80 may be provided in addition to the forward-end cover member 40 in such a way that the cylindrical sleeve member 80 surrounds an outer periphery of the soldering iron unit 10 with a radial gap. The cylindrical sleeve member 80 is located at a lower-side portion of the soldering iron unit 10, at which the heater unit 20 is not located, so that the cylindrical sleeve member 80 and the heater unit 20 do not interfere with each other in the axial direction. The cylindrical sleeve member 80 is partly projected into the cylindrical hole 42 of the forward-end cover member 40 in such a way that the side wall 46 of the forward-end cover member 40 surrounds a lower-side portion of the cylindrical sleeve member 80 with a radial gap. According to the above structure, an inner space 81 is formed between the soldering iron unit 10 and the cylindrical sleeve member 80 and an outer space 82 is formed between the cylindrical sleeve member 80 and the side wall 46 of the forward-end cover member 40.

Multiple communication holes 18 are formed in the soldering iron unit 10 in such a way that each of the communication holes 18 passes through a cylindrical wall portion of the soldering iron unit 10 in the radial direction, so that the solder supply passage portion 16 is communicated to the inner space 81 via the communication holes 18. According to the above structure, a part of the oxygen-rich gas is separated from a main stream thereof in the solder supply passage portion 16 into the inner space 81 via the communication holes 18. Then, the oxygen-rich gas is discharged to the outside of the cylindrical sleeve member 80 and the forward-end cover member 40 via the space formed by the axial gap 48 and the outer space 82. Accordingly, it is possible to make the inner space 81 to be the oxygen-rich atmosphere. In other words, it is possible to facilitate the burning of the material attached to the outer peripheral wall of the soldering iron unit 10 by the oxygen-rich gas passing through the inner space 81.

Third Modification

It is not always necessary to provide the forward-end cover member 40.

Fourth Modification

Any other gas than the oxygen-rich gas can be used as the burning-assist gas.

Fifth Modification

The soldering process may include not only the soldering process for connecting two different parts by use of the solder but also a soldering process for directly connecting two metal parts without using the solder. The processing object of the soldering process is, therefore, not limited to the printed circuit board 2.

Sixth Modification

The heater unit 20 is not limited to the structure, in which the heating wire is wound. For example, a ceramic heater may be provided in such a way that a cylindrical ceramic heater is provided so as to surround an outer periphery of the soldering iron unit 10.

What is claimed is:
1. A soldering apparatus comprising:
  a soldering iron having a soldering tip for carrying out a soldering process to a processing object;
  a heater configured to heat the soldering iron at least when the soldering process is carried out; and
  a gas supply device connected to the soldering iron, the gas supply device being configured to operatively supply a burning-assist gas to the soldering iron when a cleaning process is carried out for the soldering iron.

2. The soldering apparatus according to claim 1, wherein the gas supply device comprises:
a gas separator configured to separate air into nitrogen gas having a nitrogen density higher than that of the air and oxygen-rich gas having an oxygen density higher than that of the air, wherein the oxygen-rich gas is used as the burning-assist gas; and
a gas switching valve configured to switch gas to be supplied to the soldering iron from the nitrogen gas to the oxygen-rich gas, or vice versa.

3. The soldering apparatus according to claim 1, wherein the soldering iron is formed in a cylindrical shape in such a way that a solder supply passage extends in an axial direction of the soldering iron from a backward-end side of the soldering iron to the soldering tip, and
the burning-assist gas passes through the solder supply passage from the backward-end side to the soldering tip when the cleaning process is carried out.

4. The soldering apparatus according to claim 1, further comprising:
a forward-end cover for covering the soldering tip when the burning-assist gas is supplied to the soldering iron, in such a way that a gap is formed between the soldering tip and the forward-end cover.

5. The soldering apparatus according to claim 4, wherein the forward-end cover has heat conductivity lower than that of the soldering iron.

6. The soldering apparatus according to claim 1, further comprising:
a soldering process control portion for controlling the soldering process to the processing object; and
a cleaning process control portion for carrying out the cleaning process to the soldering iron when the soldering process to the processing object is stopped,
wherein the cleaning process control portion controls the heater in order to heat the soldering iron and further controls the gas supply device in order to supply the burning-assist gas to the soldering iron.

7. A cleaning unit for cleaning a soldering apparatus, comprising:
a soldering iron having a soldering tip for carrying out a soldering process to a processing object; and
a heater configured to heat the soldering iron,
a gas supply device connected to the soldering iron, the gas supply device being configured to operatively supply a burning-assist gas to the soldering iron, and
wherein the gas supply device comprises:
a gas separator configured to separate air into nitrogen gas having a nitrogen density higher than that of the air and oxygen-rich gas having an oxygen density higher than that of the air, wherein the oxygen-rich gas is used as the burning-assist gas; and
a gas switching valve configured to switch gas to be supplied to the soldering iron from the nitrogen gas to the oxygen-rich gas, or vice versa.

8. A manufacturing method for an electronic control unit comprising:
providing a soldering apparatus to mount an electronic component to a printed circuit board of an, wherein the soldering apparatus comprises:
a soldering iron having a soldering tip for carrying out a soldering process to the printed circuit board,
a heater unit for heating configured to heat the soldering iron unit, and
a gas supply device for operatively supplying a burning-assist gas to the soldering iron during a cleaning process for the soldering iron;
soldering the printed circuit board, in which solder is supplied to the soldering iron and the soldering is carried out by the soldering tip, which is heated by the heater; and
cleaning the soldering iron after the soldering of the printed circuit board is stopped, in which the soldering iron is heated by the heater and the burning-assist gas is supplied from the gas supply device to the soldering iron in order to clean the soldering iron.

* * * * *